(12) United States Patent
Chien et al.

(10) Patent No.: US 11,916,058 B2
(45) Date of Patent: Feb. 27, 2024

(54) MULTI-BIT STRUCTURE

(71) Applicant: TAIWAN SEMICONDUCTOR MANUFACTURING CO., LTD., Hsinchu (TW)

(72) Inventors: Shao-Lun Chien, Hsinchu (TW); Po-Chun Wang, Hsinchu (TW); Hui-Zhong Zhuang, Kaohsiung (TW); Chih-Liang Chen, Hsinchu (TW); Li-Chun Tien, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/876,909

(22) Filed: Jul. 29, 2022

(65) Prior Publication Data
US 2022/0367440 A1 Nov. 17, 2022

Related U.S. Application Data

(63) Continuation of application No. 16/915,954, filed on Jun. 29, 2020, now Pat. No. 11,444,071.

(51) Int. Cl.
*H01L 27/02* (2006.01)
*G06F 30/392* (2020.01)
*H01L 23/522* (2006.01)

(52) U.S. Cl.
CPC ........ *H01L 27/0207* (2013.01); *G06F 30/392* (2020.01); *H01L 23/5226* (2013.01)

(58) Field of Classification Search
CPC ............ H01L 27/0207; H01L 23/5226; G06F 30/392
USPC ......................................... 257/758
See application file for complete search history.

(56) References Cited

U.S. PATENT DOCUMENTS 8,681,549 B2 * 3/2014 Shalvi .................. G11C 16/34
365/185.24
11,176,979 B2 11/2021 Wang et al.

* cited by examiner

*Primary Examiner* — Tu-Tu V Ho
(74) *Attorney, Agent, or Firm* — Maschoff Brennan

(57) ABSTRACT

An integrated circuit is provided and includes a multi-bit cell having multiple bit cells disposed in multiple cell rows. The bit cells include M bit cells, M being positive integers. A first bit cell of the bit cells and a M-th bit cell of the bit cells are arranged diagonally in different cell rows in the multi-bit cell. The multi-bit cell includes first to fourth cell boundaries. The first and second boundaries extend in a first direction and the third and fourth boundaries extend in a second direction different from the first direction. The first bit cell and a second bit cell of the bit cells abut the third cell boundary, and the first bit cell and a (M/2+1)-th bit cell of the bit cells abut the first cell boundary.

20 Claims, 11 Drawing Sheets

MULTI-BIT STRUCTURE

CROSS-REFERENCE

This present application is a continuation application of U.S. application Ser. No. 16/915,954, filed Jun. 29, 2020, the full disclosure of which are incorporated herein by reference.

BACKGROUND

In order to meet the specifications of the power, performance and area for a multi-bit integrated circuit, hybrid cell structure is implemented in some approaches. The backend routing varies with different multi-bit layout structures. Alternatively stated, effective multi-bit layout structure saves metal routing and enhances performance of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
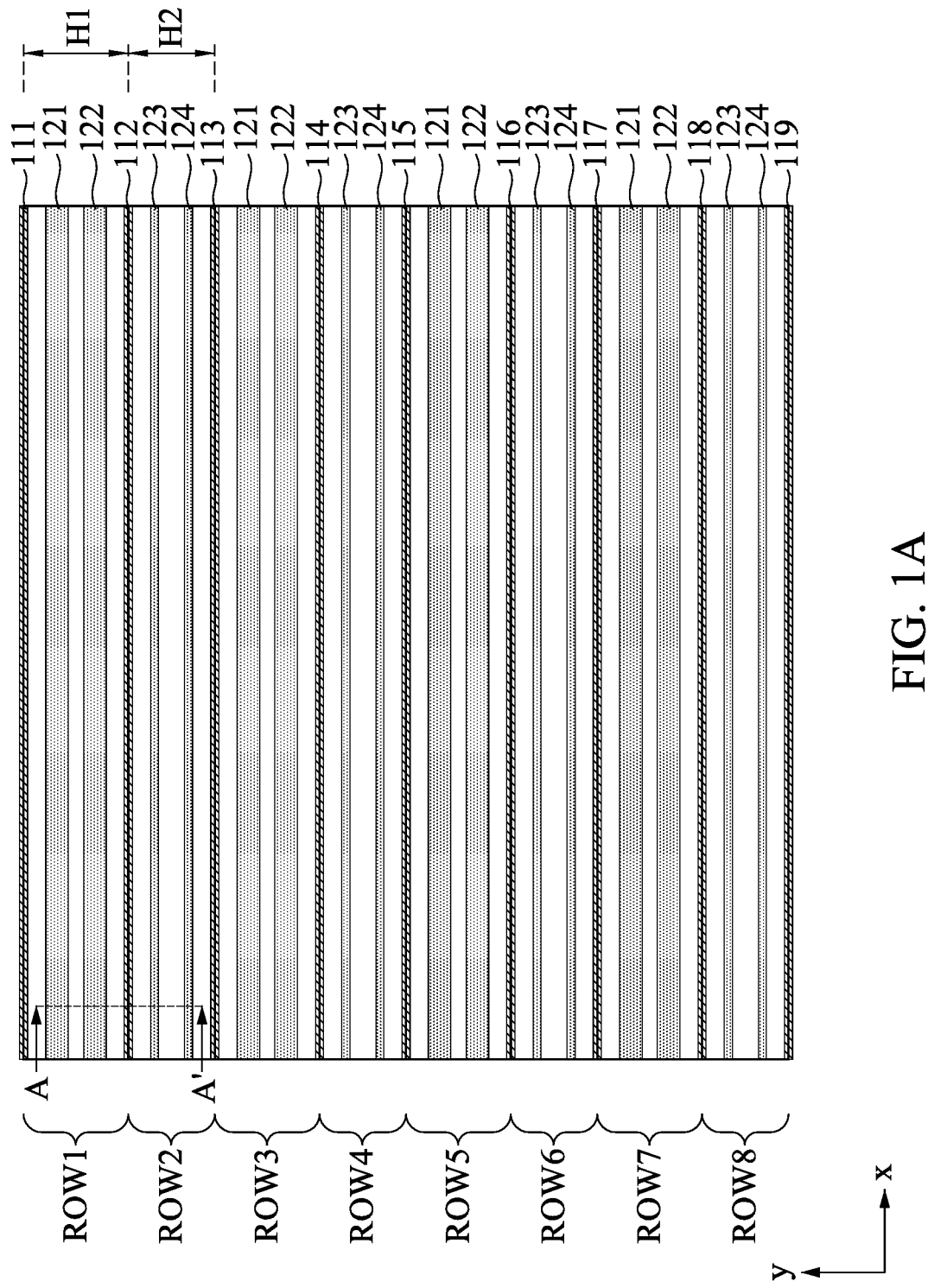
FIG. 1A is a top view diagram of part of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a top view diagram of part of an integrated circuit 10, in accordance with some embodiments. As illustratively shown in FIG. 1A, the integrated circuit 10 includes several cell rows ROW1-ROW8. The number of the cell rows ROW1-ROW8 in the integrated circuit 10 in FIG. 1A is given for illustrative purposes. Various numbers of the cell rows ROW1-ROW8 are within the contemplated scope of the present disclosure. For example, in some embodiments, the number of the cell rows in the integrated circuit 10 is more than 8 or less than 8.

For illustration, the cell rows ROW1-ROW8 extends along x direction and are parallel to each other. In some embodiments, the cell rows ROW1-ROW8 are arranged along y direction, which is substantially perpendicular to the x direction.

In some embodiments, there are two groups of cell rows among the rows ROW1-ROW8 in reference with their row heights. As illustratively shown in FIG. 1A, each of the cell rows ROW1, ROW3, ROW5, and ROW7 is configured to have a row height H1, and each of the cell rows ROW2, ROW4, ROW6, and ROW8 is configured to have another row height H2, which is shorter than the row height H1. The cell rows ROW1, ROW3, ROW5, and ROW7 with the row height H1 are regarded as a first group "A" of the cell rows ROW1-ROW8, and the cell rows ROW2, ROW4, ROW6, and ROW8 are regarded as a second group "B" of the cell rows ROW1-ROW8. In some embodiments, as depicted in FIG. 1A, the first group A of the cell rows and the second group B of the cell rows are interlaced.

In some embodiments, a number of metal zero line (i.e., not shown, the metal layer for routing in the integrated circuit) included in the cell rows of the first group "A" is greater than that included in the cell rows of the second group "B", due to different row heights.

As shown in FIG. 1A, the integrated circuit 10 includes power rails 111-119. For illustration, the power rails extend in x direction and are separated from each other in y direction. In some embodiments, the power rails 111-119 are arranged at boundaries of the cell rows ROW1-ROW8. Moreover, in some embodiments, the power rails 111-119 are configured to provide cells included in the integrated circuit 10 power voltages, for example, voltages VDD and VSS, in which a voltage level of the voltage VDD is higher than that of the voltage VSS. For example, the power rails 111, 113, 115, 117, and 119 provide the voltage VDD, and the power rails 112, 114, 116, and 118 provide/receive the voltage VSS. The configurations of the power rails 111-119 are given for illustrative purposes. Various implements of the power rails are within the contemplated scope of the present disclosure. For example, in some embodiments, the power rails 112, 114, 116, and 118 provide the voltage VDD, and the power rails 111, 113, 115, 117, and 119 provide/receive the voltage VSS.

For illustration, the cell row ROW1 with the row height H1 in the first group "A" includes two active areas 121-122, and the cell row ROW2 with the row height H2 in the second group "B" includes two active areas 123-124. Similarly, the cell rows ROW3, ROW5, ROW7 are configured with respect, for example, the cell ROW1 to include the active areas 121-122. The cell rows ROW3, ROW5, ROW7 are configured with respect, for example, the cell ROW1 to include the active areas 121-122. The cell rows ROW4, ROW6, and ROW8 are configured with respect, for example, the cell ROW2 to include the active areas 123-124. Alternatively stated, the cell rows ROW1-ROW8 are interlaced in a periodic sequence along y direction. For illustration, the active areas 121-124 extend along x direction and are separate from each other in y direction. The configurations of the active areas 121-124 will be discussed in the following paragraphs with FIG. 1B.

In some embodiments, the active areas 121 and 124 have a conductivity of P type, while the active areas 122 and 123 have a conductivity of N type. The configurations of the active areas 121-124 are given for illustrative purposes. Various implements of the active areas 121-124 are included in the contemplated scope of the present disclosure. For example, in some embodiments, the active areas 121 and 124 are N type and the active areas 122 and 123 are P type.

Figure 1B:
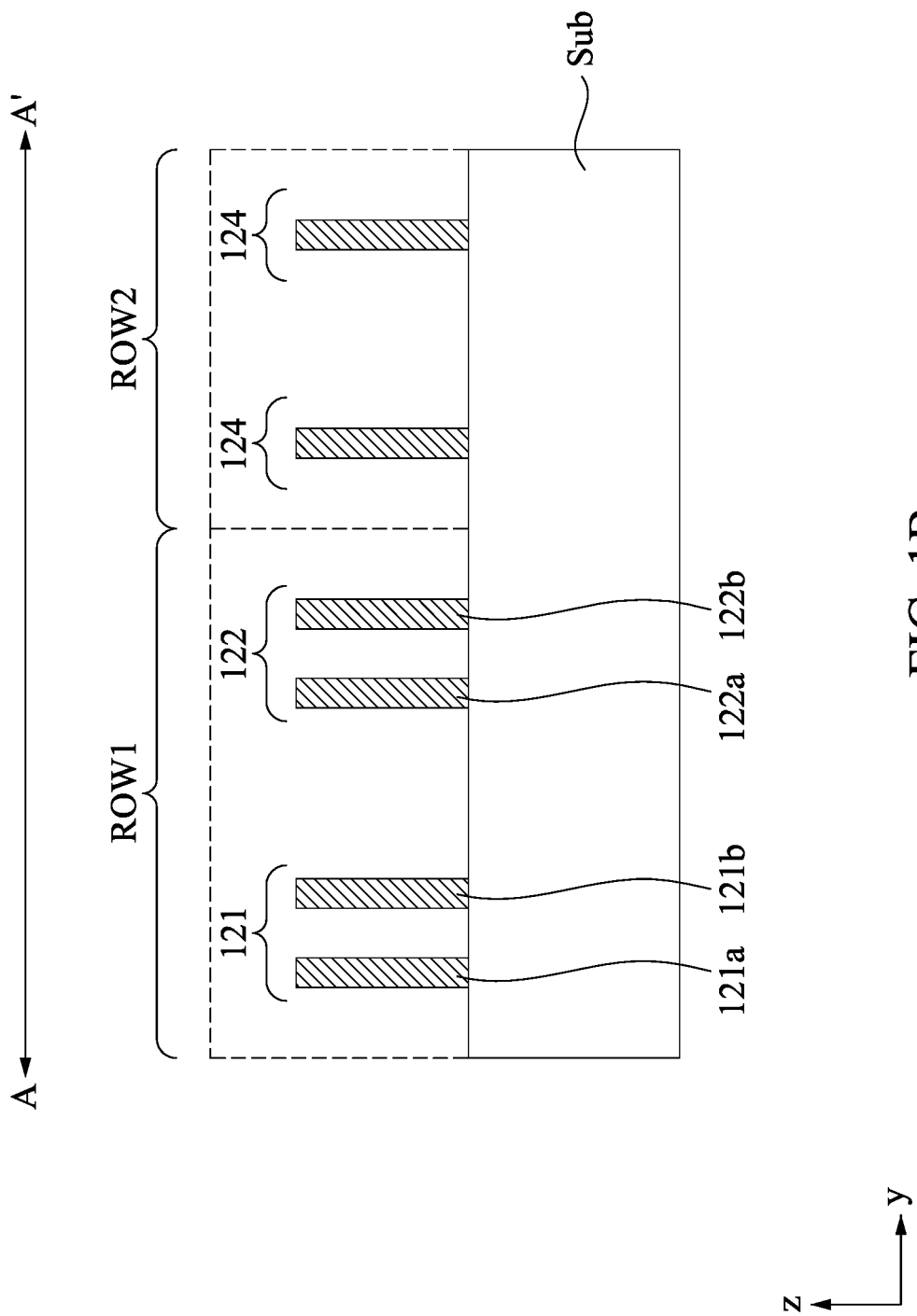
FIG. 1B is a sectional view diagram illustrating a structure of some cell rows along a sectional line in FIG. 1A in accordance with some embodiments.

Reference is now made to FIG. 1B. FIG. 1B is a sectional view diagram illustrating a structure of the cell rows ROW1-ROW2 along a sectional line AA' in FIG. 1A in accordance with some embodiments. With respect to the embodiments of FIG. 1A, like elements in FIG. 1B are designated with the same reference numbers for ease of understanding.

As illustratively shown in FIG. 1B, the cell row ROW1 with the row height H1 in the first group "A" includes the active areas 121-122 on a substrate Sub. The active area 121 of the cell row ROW1 includes two fin-shaped structures 121a and 121b, and the active area 122 of the cell row ROW1 includes another two fin-shaped structures 122a and 122b. Alternatively stated, each one of the active areas 121-122 includes two fin-shaped structures, such as 121a and 121b, or 122a and 122b.

In some embodiments, the fin-shaped structures 121a and 121b are n-type fin-shaped structures, and the fin-shaped structures 122a and 122b are p-type fin-shaped structures. In some other embodiments, the fin-shaped structures 121a and 121b are p-type fin-shaped structures, and the fin-shaped structures 122a and 122b are n-type fin-shaped structures.

As illustratively shown in FIG. 1B, the cell row ROW2 with the row height H2 in the second group "B" includes two active areas 123-124 on the substrate Sub. The active area 123 of the cell row ROW2 includes a first one fin-shaped structure, and the active area 124 of the cell row ROW2 includes a second one fin-shaped structure. Alternatively stated, each one of the active areas 123-124 includes one fin-shaped structure.

The fins mentioned above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, such an active area may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor (s).

In some embodiments, the active area 121 of the cell row ROW1 includes two fin-shaped structures 121a and 121b together as an active region to form an integrated circuit component (such as a transistor), such that an equivalent width of the active region of the integrated circuit component disposed on the active area 121 will be wider than one of another integrated circuit component disposed on the active area 123, which includes the first one fin-shaped structure. Alternatively stated, in some embodiments, integrated circuit components included on the cell row ROW1 have a better performance than integrated circuit components included on the cell row ROW2.

Figure 2:
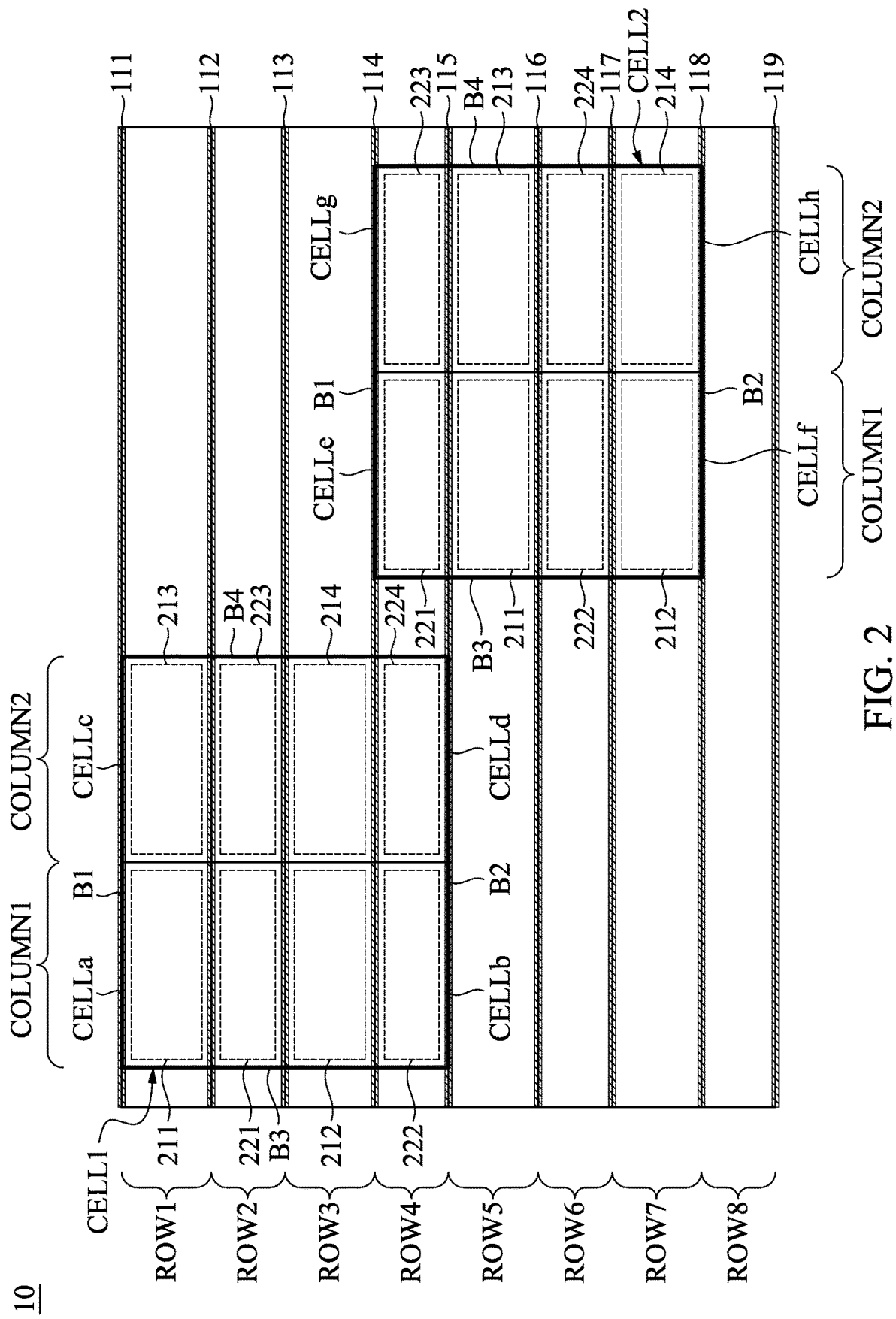
FIG. 2 is a floor planning or layout view of multi-bit cells arranged in the integrated circuit of FIG. 1A in accordance with some embodiments.

Reference is now made to FIG. 2. FIG. 2 is a floor planning or layout view of multi-bit cells CELL1-CELL2 arranged in the integrated circuit 10 of FIG. 1A in accordance with some embodiments. With respect to the embodiments of FIGS. 1A-1B, like elements in FIG. 2 are designated with the same reference numbers for ease of understanding. In some embodiments, the cells CELL-CELL2 are different standard cells with particular circuit functions (e.g., switch, amplifier, filter, adder, multiplexer, flip-flops, add-logic gate, or-logic gate, inverter, or current mirror) selected from standard cell libraries. In some embodiments, the cells CELL-CELL2 are similar standard cells with different layouts.

As illustratively shown in FIG. 2, the cell CELL1 is included in the cell rows ROW1-ROW4. The cell CELL1 includes bit cells CELLa-CELLd. For illustration, the bit cells CELLa and CELLc include the cell rows ROW1-ROW2, and the bit cells CELLb and CELLd include the cell rows ROW3-ROW4. Furthermore, as shown in FIG. 2, the cells CELLa and CELLb are arranged in a column COLUMN1 of the cell CELL1 and the cells CELLc and CELLd are arranged in a column COLUMN2 of the cell CELL1. The columns COLUMN1-COLUMN2 extend in y direction.

The cell CELL1 has cell boundaries B1-B4. The cell boundaries B1-B2 extend in x direction and are separated from each other in y direction, and the cell boundaries B3-B4 extend in y direction and are separated from each other in x direction. As shown in FIG. 2, the bit cells CELLa and CELL1c abut the boundary B1 together and abut each other along x direction. The bit cells CELLb and CELLd abut the boundary B2 together and abut each other along x direction. The bit cells CELLa and CELLb abut the boundary B3 together and abut each other along y direction. The bit cells CELLc and CELLd abut the boundary B4 together and abut each other along x direction. Alternatively stated, the bit cells CELLa and CELLd are arranged diagonally in the cell CELL1.

The bit cells CELLa-CELLd of the cell CELL1 have the same circuit configurations. In some embodiments, the cell CELL1 is configured to operate as a multi-bit flip-flop circuit having M bits, and M is 4 in the embodiments of FIG. 2. Accordingly, the bit cells CELLa-CELLd are configured to include flip-flop circuits corresponding to first to fourth bit data separately. In some embodiments, in the multi-bit circuit mentioned above, an output signal of a N-th bit cell is an input signal of a (N+1)-th bit cell, N being a positive integer smaller or equal to M. For example, in the embodiments of FIG. 2, an output signal of the first bit cell CELLa is an input signal of the second bit cell CELL1b, and so on. In other embodiments, the correlations of bits and the bit cells CELLa-CELLd are different from what mentioned above and will be discussed in detail through FIGS. 3A-7B.

With continued reference to FIG. 2, for illustration, the cell CELL1 further includes input stage cells 211-214 and data cell 221-224. As shown in FIG. 2, the bit cell CELL1a includes the input stage cell 211 in the cell row ROW1 and the data cell 221 in the cell row ROW2. The bit cell CELL1b includes the input stage cell 212 in the cell row ROW3 and the data cell 222 in the cell row ROW4. The bit cell CELL1c includes the input stage cell 213 in the cell row ROW1 and the data cell 223 in the cell row ROW2. The bit cell CELL1d includes the input stage cell 214 in the cell row ROW3 and the data cell 224 in the cell row ROW4.

In some embodiments, as shown in FIG. 2, the power rail 112 is disposed between the input stage cell 211 and the data cell 221, and is also between the input stage cell 213 and the data cell 223. The power rail 113 is disposed between the data cell 221 and the input stage cell 212, and is also between the data cell 223 and the input stage cell 214. The power rail 114 is disposed between the input stage cell 212 and the data cell 222, and is also between the input stage cell 214 and the data cell 224. Alternatively stated, in some embodiments, the power rail is shared by cells disposed on the opposite sides thereof.

In some embodiments, for example, the input stage cell 211 of the bit cell CELLa is configured to receive a scan data input (SI) for the bit cell CELLa, and the data cell 221 is configured to store the first bit data in response to the scan data input and a data signal, and further configured to output the stored first bit data as the output signal to the input stage cell 212 of the bit cell CELLb. The configurations of the input stage cells 212-214 and the data cells 222-224 are similar to that of the input stage cell 211 and the data cell 221. Thus, the repetitious descriptions are omitted here. Alternatively stated, an output signal of the data cell in the bit cell of N-th bit is input as an input signal of the input stage cell in the bit cell of (N+1)-th bit.

With continued reference to FIG. 2, the cell CELL2 is included in the cell rows ROW4-ROW7. The cell CELL2 includes bit cells CELLe-CELLh. For illustration, the bit cells CELLe and CELLg include the cell rows ROW4-ROW5, and the bit cells CELLf and CELLh include the cell rows ROW6-ROW7. The bit cells CELLe-CELLh are configured with respect to, for example, the bit cells CELLa-CELLd separately. Furthermore, as shown in FIG. 2, the cells CELLe and CELLf are arranged in the column COLUMN1 and the cells CELLg and CELLh are arranged in the column COLUMN2.

Compared with the cell CELL1, for example, instead of arranging the input stage cell 211 closer to the cell boundary B1, compared with the data cell 221, in the bit cell CELLe the data cell 221 is arranged closer to the cell boundary B1 compared the input stage cell 211. Alternatively stated, the placements of the input stage cells and the data cells are switched in the cell CELL2. The configurations in the bit cells CELLf-CELLh are similar to that in the bit cell CELLe. Thus, the repetitious descriptions are omitted for the sake of simplicity.

The configurations of FIG. 2 are given for illustrative purposes. Various implements are within the contemplated scope of the present disclosure. For example, the number M of bit cells included in the multi-bit cell circuit is more than 4.

Figures 3A, 3B:
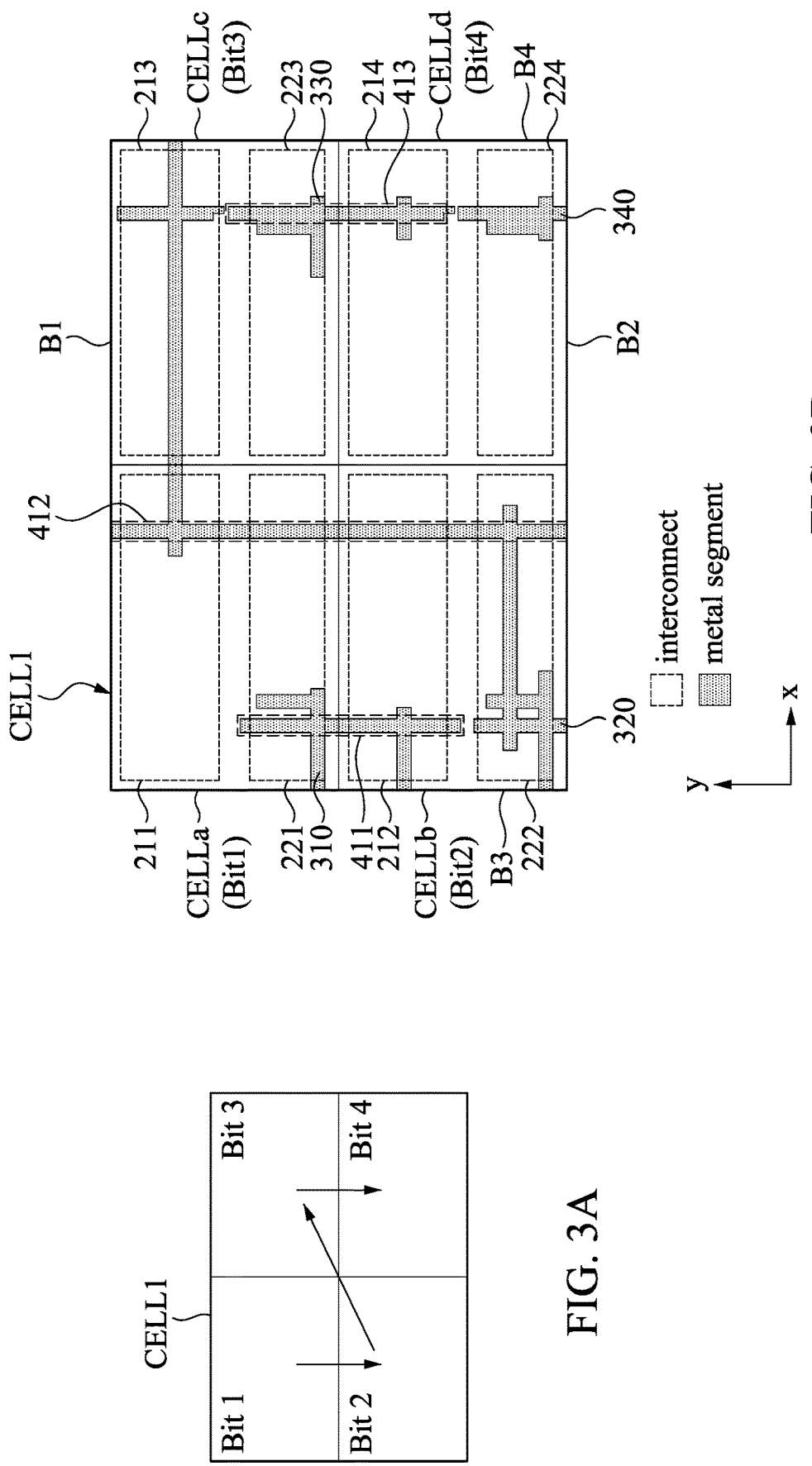
FIGS. 3A-3B are detailed floor planning or layout views of a multi-bit cell in the integrated circuit of FIG. 1A, in accordance with some embodiments.

FIGS. 3A-3B are detailed floor planning or layout views of the multi-bit cell CELL1 in the integrated circuit of FIG. 1A, in accordance with some embodiments. With respect to the embodiments of FIGS. 1A-2, like elements in FIGS. 3A-3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 3A-3B.

Reference is now made to FIG. 3A. As shown in FIG. 3A, bit cells in the cell CELL1 are arranged in accordance with a guideline. In some embodiments, the guideline indicates that a first bit cell of a multi-bit cell is arranged in a first row of multiple rows and a first column of multiple columns of a multi-bit cell having M bit cells in total, and a M-th bit cell of the multi-bit cell is arranged in the last row of the rows and a second column of the columns, in which the rows extend in a first direction and are arranged in a second direction different from the first direction, and the columns extend in the second direction and are arranged in the first direction. Alternatively stated, the guideline indicated that the bit cells are arranged in sequence and in a zig-zag format (i.e., N-shape) on a floor plan. For example, in FIG. 3A, the cell corresponding to bit 1 (i.e., the first bit cell) is in a first row and a first column, and the cell corresponding to bit 4 (i.e., the fourth bit cell) is in a second row below the first row and a second column next to the first column. Alternatively stated, the first and fourth bit cells are arranged diagonally in the cell CELL1, and the second and third bit cells are arranged diagonally in the cell CELL1. The cell corresponding to bit 2 (i.e., the second bit cell) abuts the first bit cell along y direction, and the cell corresponding to bit 3 (i.e., the third bit cell) abuts the first bit cell along x direction. Arrows in FIG. 3A indicate directions in which the first bit cell transmits an output signal to the second bit cell, the second bit cell transmits an output signal to the third bit cell, and the third bit cell transmits an output signal to the fourth bit cell. Alternatively stated, the first and third bit cells, abutting the same cell boundary extending in x direction, transmit output signals in the same direction.

Reference is now made to FIG. 3B. As illustratively shown in FIG. 3B, in cell CELL1, the bit cells CELLa-CELL1d correspond to bit 1 to bit 4 separately, and are referred as the first to fourth bit cells. The first bit cell CELLa abuts the cell boundary B1, and the fourth bit cell CELLd abuts the cell boundary B2. The first and second bit cells CELLa-CELLb abut the cell boundary B3. The third and fourth bit cells abut the cell boundary B4. Alternatively stated, the second and third bit cells CELLb-CELLc are arranged in different cell rows.

For illustration, the input stage cells 211 of the first bit cell CELLa and 213 of the third bit cell CELLc are arranged in the top most row in the cell CELL1. The data cells 222 of the second bit cell CELLb and 224 of the fourth bit cell CELLd are arranged in the bottom most row in the cell CELL1. Accordingly, the data cells 221 of the first bit cell CELLa and 223 of the third bit cell CELLc are arranged in the same cell row in the cell CELL1. The input stage cells 212 of the second bit cell CELLa and 214 of the fourth bit cell CELLd are arranged in the same row in the cell CELL1.

With reference to FIGS. 3A-3B and the discussions above, in some embodiments, the signal output by the data cell 221 of the first bit cell CELLa and the signal output by the data cell 223 of the third bit cell CELLc are transmitted in the same direction (i.e., the negative direction of y axis).

As shown in FIG. 3B, the cell CELL1 further includes metal segments 310-340. For illustration, a portion of the metal segment 310 is included in the data cell 221 of the first bit cell CELLa, another portion of the metal segment 310 is included in the input stage cell 212 of the second bit cell CELLb. A portion of the metal segment 320 is included in the data cell 222 of the second bit cell CELLb, another portion of the metal segment 320 is included in the input stage cell 213 of the third bit cell CELLc. A portion of the metal segment 330 is included in the data cell 223 of the third bit cell CELLc, another portion of the metal segment 330 is included in the input stage cell 214 of the fourth bit cell CELLd. The metal segment 340 is included in the data cell 224 of the fourth bit cell CELLd. In some embodiments, the metal segments 310-340 are configured to be as the combinations of metal layers for routing of the input stage cells 212-214 and the data cells 221-224. The metal layers include, for example, back-end-of-line (BEOL) metal zero M0, metal one M1, and/or metal two M2. In some embodiments, the metal segments 310-340 are arranged over semiconductor structures included in transistors being formed in the bit cells CELLa-CELLd.

For illustration, an interconnect 411 formed in the metal segment 310 extends in y direction from the first bit cell CELLa to the second bit cell CELLb. In some embodiments, the interconnect 411 is configured to be shared by the first and second bit cells to transmit the output signal of the first bit cell CELLa as the input signal of the second bit cell CELLb.

An interconnect 412 formed in the metal segment 320 extends in y direction from the bottom most row to the top most row in the cell CELL1. In some embodiments, the interconnect 412 is configured to be shared by the second and third bit cells to transmit the output signal of the second bit cell CELLb as the input signal of the third bit cell CELLc. Alternatively stated, the interconnect 412 is included in a structure to connect the second bit cell CELLb and the third bit cell CELLc. In some embodiments, the interconnect 412 is arranged between the first bit cell CELLa and the fourth bit cells CELLd. To explain in another way, the first bit cell CELLa and the fourth bit cells CELLd are arranged at the opposite sides of the interconnect 412.

An interconnect 413 formed in the metal segment 330 extends in y direction from the third bit cell CELLc to the fourth bit cell CELLd. In some embodiments, the interconnect 413 is configured to be shared by the third and fourth bit cells to transmit the output signal of the third bit cell CELLc as the input signal of the fourth bit cell CELLd.

In some approaches, a multi-bit cell is implemented by placing bit cells in sequence with U or reversed-U shapes. For example, in a 4-bit cell, both the first and fourth bit cells abut the same cell boundary, such like one of the cell boundaries B1-B4 of FIG. 3B, and further directly abut each other. In such arrangements, more metal tracks and area are needed for routing. Compared with some approaches, with the configurations of the present disclosure, redundant metal routing is reduced by the interconnect (metal segment) being shared by two sequential bit cells, and the area efficiency is correspondingly improved. With less routing, RC effect induced by metal routing is correspondingly reduced. Accordingly, the performance of the integrated circuit is enhanced. In some embodiments of the present disclosure, the area of metal routing is reduced by about 5-6%, and the power consumption is saved by about 3-5%.

The configurations of FIGS. 3A-3B are given for illustrative purposes. Various implements of FIGS. 3A-3B are within the contemplated scope of the present disclosure. For example, in some embodiments, patterns of the metal segments 310-340 are different from the metal segments 310-340 as shown in FIG. 3B.

Figures 4A, 4B:
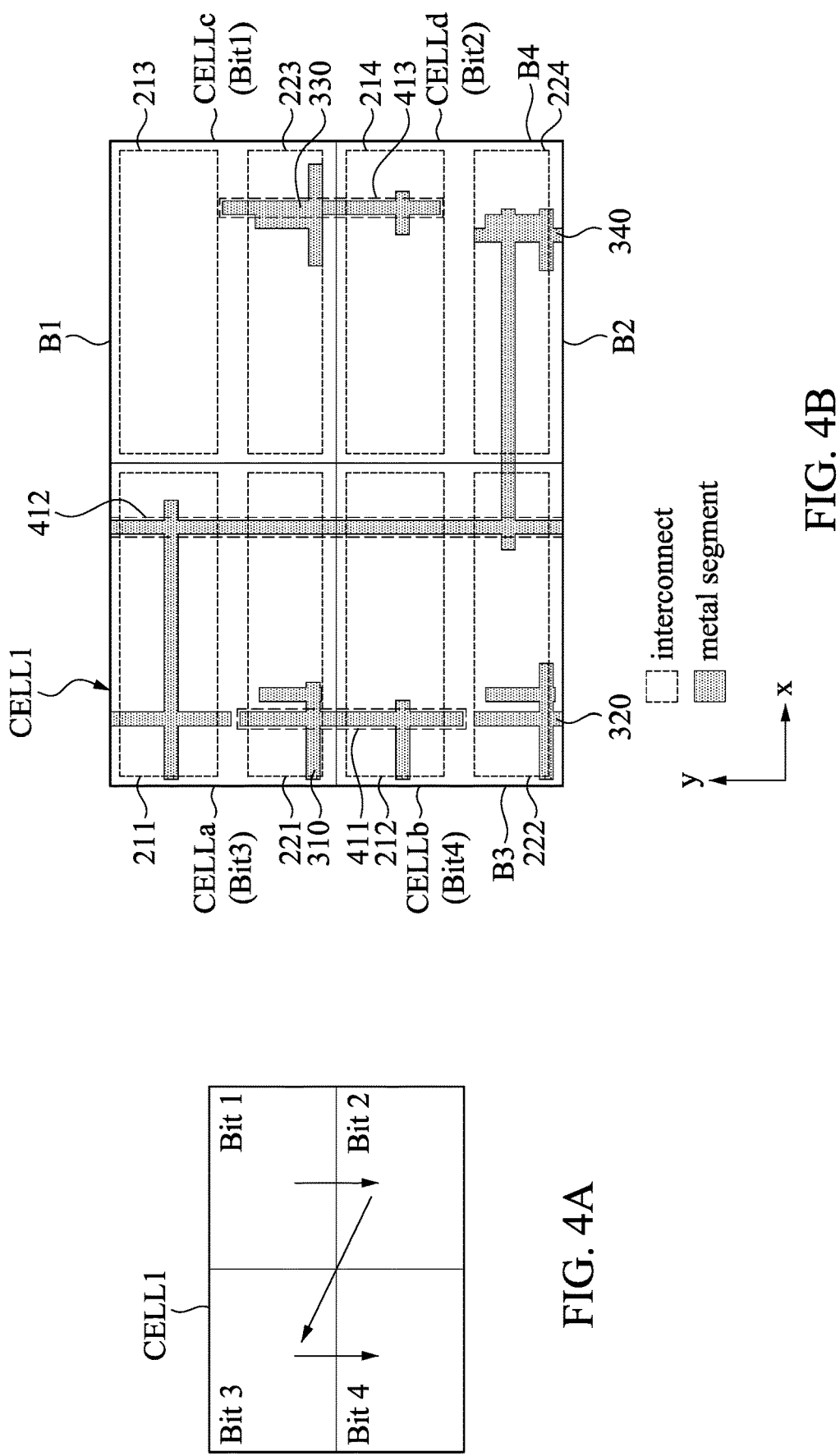
FIGS. 4A-4B are other detailed floor planning or layout views of the multi-bit cell in the integrated circuit of FIG. 1A, in accordance with some embodiments.

FIGS. 4A-4B are other detailed floor planning or layout views of the multi-bit cell CELL1 in the integrated circuit of FIG. 1A, in accordance with some embodiments. With respect to the embodiments of FIGS. 1A-3B, like elements in FIGS. 4A-4B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 4A-4B.

Reference is now made to FIG. 4A. Compared with FIG. 3A, the cells corresponding to bit 1 and bit 3 are placed alternatively, and the cells corresponding to bit 2 and bit 4 are placed alternatively. The arrangement of the bit cells in the cell CELL1 of FIG. 4A still follows and satisfies the guideline.

In some embodiments, the bit cell CELLc corresponds to bit 1 and is referred as the first bit cell. The bit cell CELLd corresponds to bit 2 and is referred as the second bit cell. The bit cell CELLa corresponds to bit 3 and is referred as the third bit cell. The bit cell CELLb corresponds to bit 4 and is referred as the fourth bit cell.

Reference is now made to FIG. 4B. Compared with FIG. 3B, the portion of the metal segment 320 included in the input stage cell 213 is eliminated. The metal segment 340 further includes a portion included in the input stage cell 211 of the third bit cell CELLa.

For illustration, the interconnect 413 is configured to be shared by the first and second bit cells to transmit the output signal of the first bit cell CELLc as the input signal of the second bit cell CELLd. The interconnect 412 is configured to be shared by the second and third bit cells to transmit the output signal of the second bit cell CELLd as the input signal of the third bit cell CELLa. The interconnect 411 is configured to be shared by the third and fourth bit cells to transmit the output signal of the third bit cell CELLa as the input signal of the fourth bit cell CELLb.

Figures 5A, 5B:
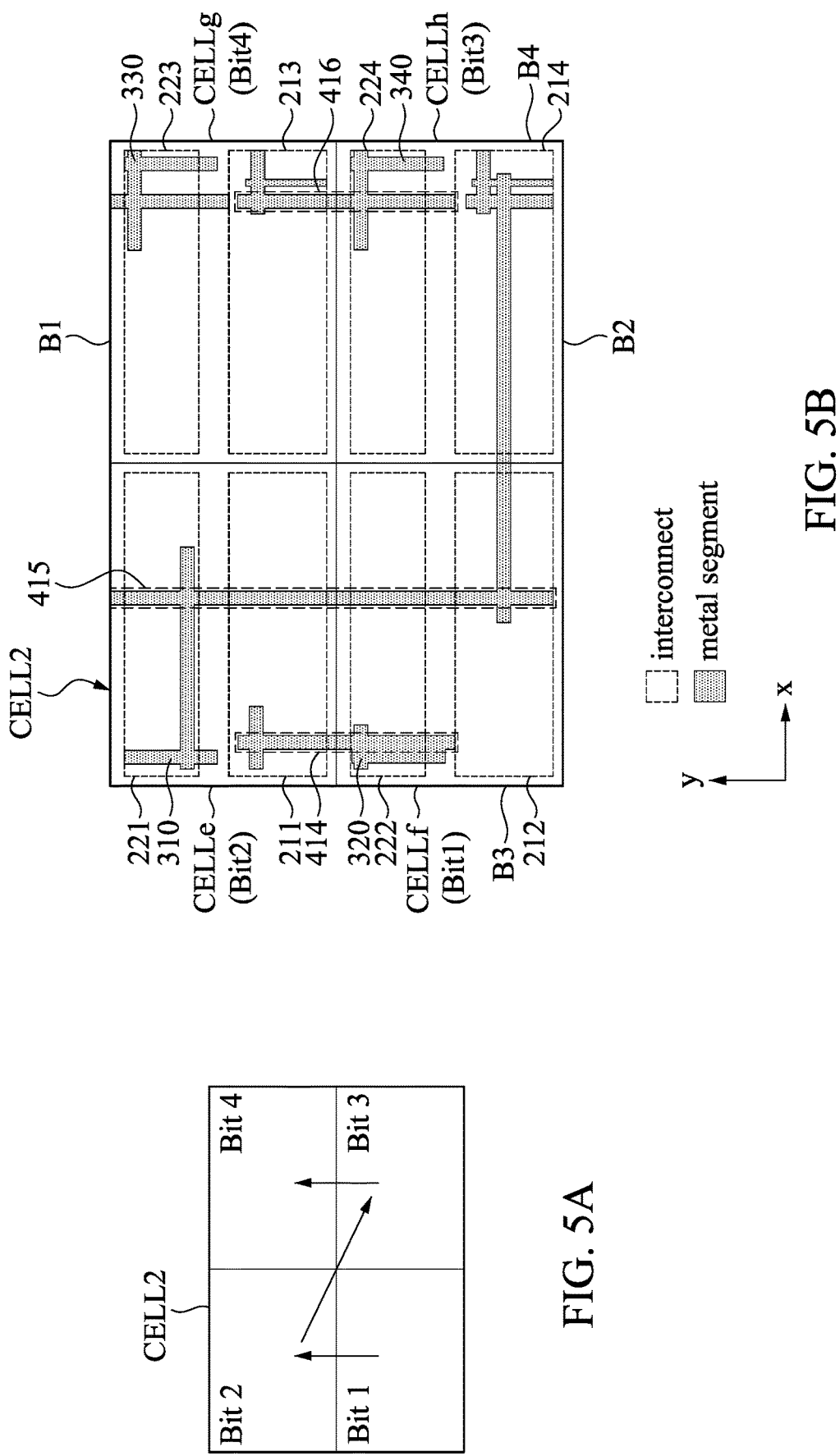
FIGS. 5A-5B are detailed floor planning or layout views of a multi-bit cell in the integrated circuit of FIG. 1A, in accordance with some embodiments.

FIGS. 5A-5B are detailed floor planning or layout views of the multi-bit cell CELL2 in the integrated circuit of FIG. 1A, in accordance with some embodiments. With respect to the embodiments of FIGS. 1A-4B, like elements in FIGS. 5A-5B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 5A-5B.

Reference is now made to FIG. 5A. Compared with FIG. 3A, the cells corresponding to bit 1 and bit 2 are placed alternatively, and the cells corresponding to bit 3 and bit 4 are placed alternatively. The arrangement of the bit cells in the cell CELL2 of FIG. 5A still follows and satisfies the guideline.

In some embodiments, the bit cell CELLf corresponds to bit 1 and is referred as the first bit cell. The bit cell CELLe corresponds to bit 2 and is referred as the second bit cell. The bit cell CELLh corresponds to bit 3 and is referred as the third bit cell. The bit cell CELLg corresponds to bit 4 and is referred as the fourth bit cell.

Reference is now made to FIG. 5B. Compared with FIG. 3B, the input stage cells 212 of the first bit cell CELLf and 214 of the third bit cell CELLh are arranged in the bottom most row in the cell CELL1. The data cells 221 of the second bit cell CELLe and 223 of the fourth bit cell CELLg are arranged in the top most row in the cell CELL1. Accordingly, the data cells 222 of the first bit cell CELLf and 224 of the third bit cell CELLh are arranged in the same cell row in the cell CELL1. The input stage cells 211 of the second bit cell CELLe and 213 of the fourth bit cell CELLg are arranged in the same row in the cell CELL1.

With reference to FIGS. 5A-5B and the discussions above, in some embodiments, the signal output by the data cell 222 of the first bit cell CELLf and the signal output by the data cell 224 of the third bit cell CELLh are transmitted in the same direction (i.e., the positive direction of y axis).

For illustration, the portion of the metal segment 310 included in the input stage cell 211 is eliminated, and the metal segment 310 further includes a portion included in the input stage cell 214 of the third bit cell CELLh. The portion of the metal segment 320 included in the input stage cell 213 is eliminated, and the metal segment 320 further include a portion included in the input stage cell 211. The portion of the metal segment 330 included in the input stage cell 214 is eliminated. The metal segment 340 further includes a portion included in the input stage cell 213 of the fourth bit cell CELLg.

For illustration, an interconnect 414 formed in the metal segment 320 extends in y direction from the first bit cell CELLf to the second bit cell CELLe. An interconnect 415 formed in the metal segment 310 extends in y direction from the bottom most row to the top most row in the cell CELL1. An interconnect 416 formed in the metal segment 340 extends in y direction from the third bit cell CELLh to the fourth bit cell CELLg. In some embodiments, the interconnect 414 is configured with respect to, for example, the interconnect 411 of FIG. 3B, the interconnect 415 is configured with respect to, for example, the interconnect 412 of FIG. 3B, and the interconnect 416 is configured with respect to, for example, the interconnect 413 of FIG. 3B.

In some embodiments, the interconnect 414 is shared by the first and second bit cells to transmit the output signal of the first bit cell CELLf as the input signal of the second bit cell CELLe. The interconnect 415 is shared by the second and third bit cells to transmit the output signal of the second bit cell CELLe as the input signal of the third bit cell CELLh. The interconnect 416 is shared by the third and fourth bit cells to transmit the output signal of the third bit cell CELLh as the input signal of the fourth bit cell CELLg.

The configurations of FIGS. 5A-5B are given for illustrative purposes. Various implements of FIGS. 5A-5B are within the contemplated scope of the present disclosure. For example, in some embodiments, patterns of the metal segments 310-340 are different from the metal segments 310-340 as shown in FIG. 5B.

Figures 6A, 6B:
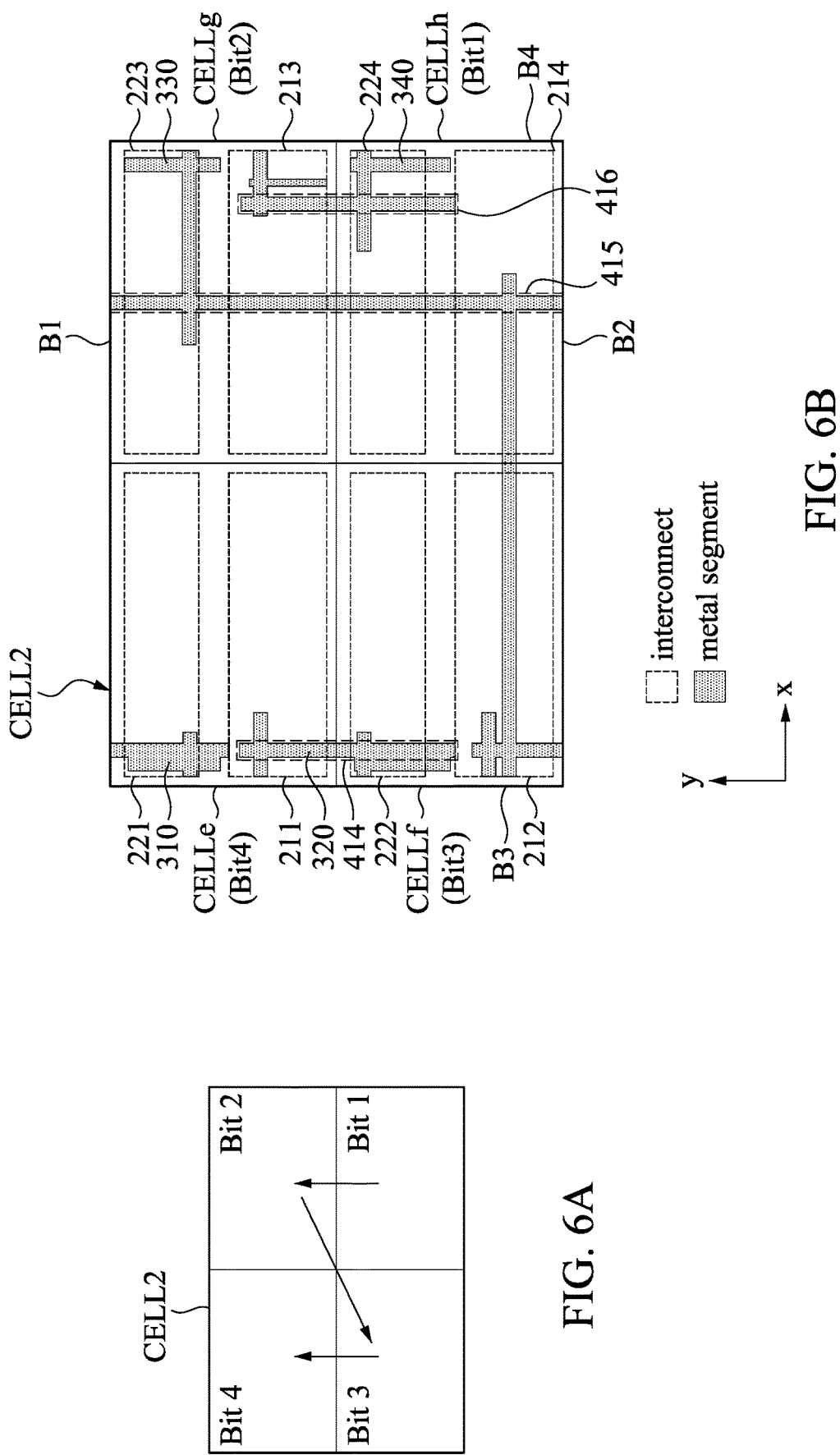
FIGS. 6A-6B are other detailed floor planning or layout views of the multi-bit cell in the integrated circuit of FIG. 1A, in accordance with some embodiments.

FIGS. 6A-6B are other detailed floor planning or layout views of the multi-bit cell CELL2 in the integrated circuit of FIG. 1A, in accordance with some embodiments. With respect to the embodiments of FIGS. 1A-5B, like elements in FIGS. 6A-6B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIGS. 6A-6B.

Reference is now made to FIG. 6A. Compared with FIG. 5A, the cells corresponding to bit 1 and bit 3 are placed alternatively, and the cells corresponding to bit 2 and bit 4 are placed alternatively. The arrangement of the bit cells in the cell CELL2 of FIG. 6A still follows and satisfies the guideline.

In some embodiments, the bit cell CELLh corresponds to bit 1 and is referred as the first bit cell. The bit cell CELLg corresponds to bit 2 and is referred as the second bit cell. The bit cell CELLf corresponds to bit 3 and is referred as the third bit cell. The bit cell CELLe corresponds to bit 4 and is referred as the fourth bit cell.

Reference is now made to FIG. 6B. Compared with FIG. 5B, the portion of the metal segment 310 included in the input stage cell 214 is eliminated. The metal segment 330 further includes a portion included in the input stage cell 212 of the third bit cell CELLf.

For illustration, the interconnect 416 is configured to be shared by the first and second bit cells to transmit the output signal of the first bit cell CELLh as the input signal of the second bit cell CELLg. The interconnect 415 is configured to be shared by the second and third bit cells to transmit the output signal of the second bit cell CELLg as the input signal of the third bit cell CELLf. The interconnect 414 is configured to be shared by the third and fourth bit cells to transmit the output signal of the third bit cell CELLf as the input signal of the fourth bit cell CELLe.

The configurations of FIGS. 6A-6B are given for illustrative purposes. Various implements of FIGS. 6A-6B are within the contemplated scope of the present disclosure. For example, in some embodiments, patterns of the metal segments 310-340 are different from the metal segments 310-340 as shown in FIG. 6B.

Figure 7B:
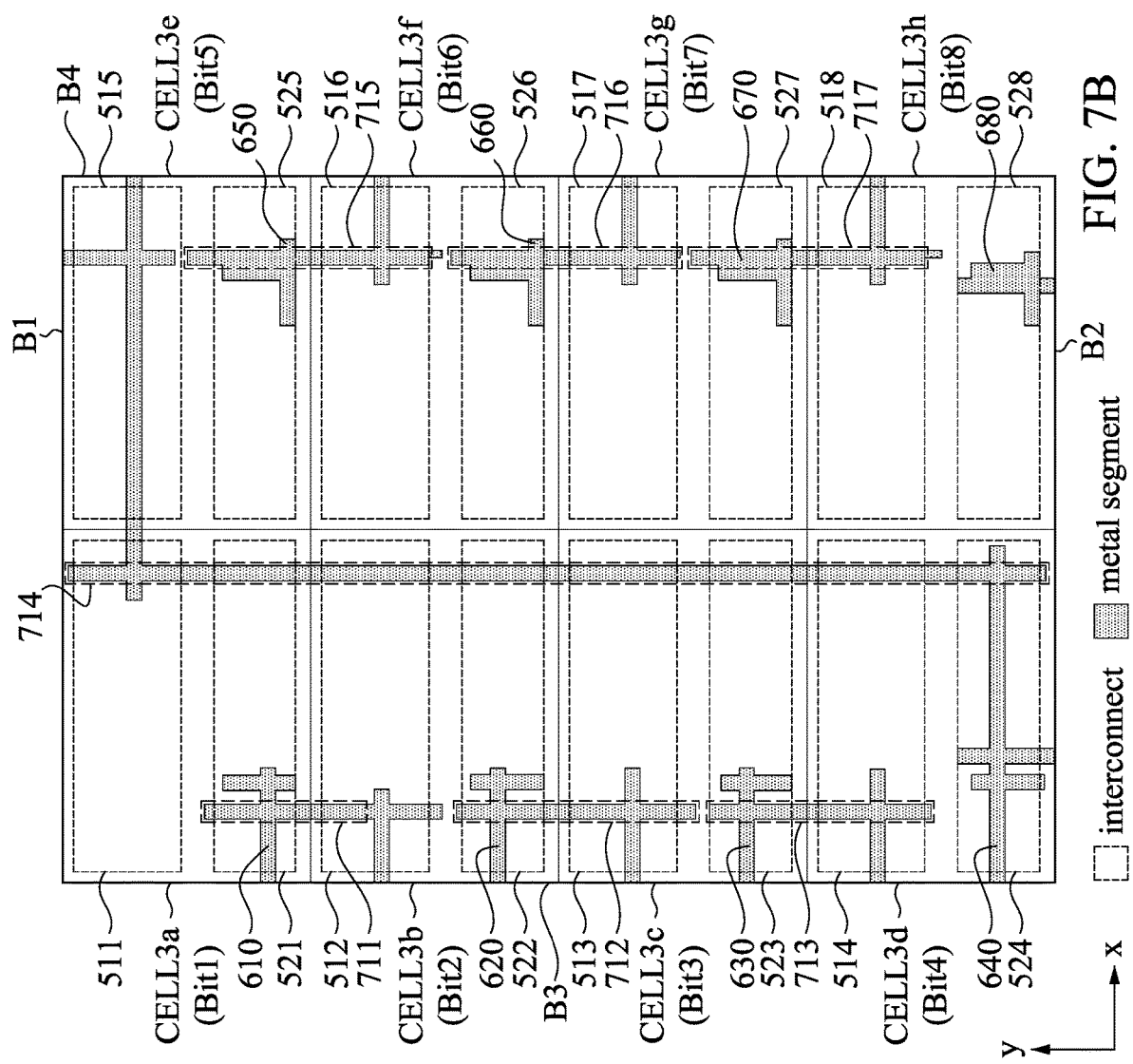
FIGS. 7A-7B are detailed floor planning or layout views of a multi-bit cell in the integrated circuit of FIG. 1A, in accordance with some embodiments.
Figure 7A:
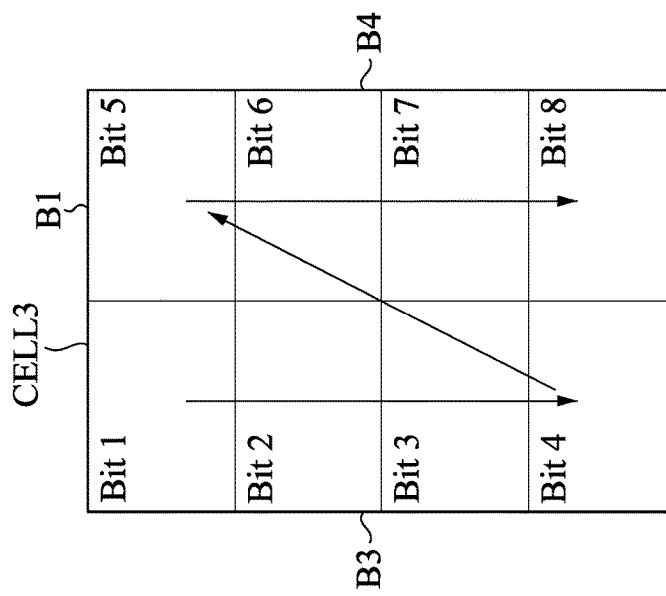

FIGS. 7A-7B are detailed floor planning or layout views of a multi-bit cell CELL3 in the integrated circuit of FIG. 1A, in accordance with some embodiments. In some embodiments, the cell CELL3 is configured with respect to, for example, the cell CELL1 of FIG. 2.

Figure 8:
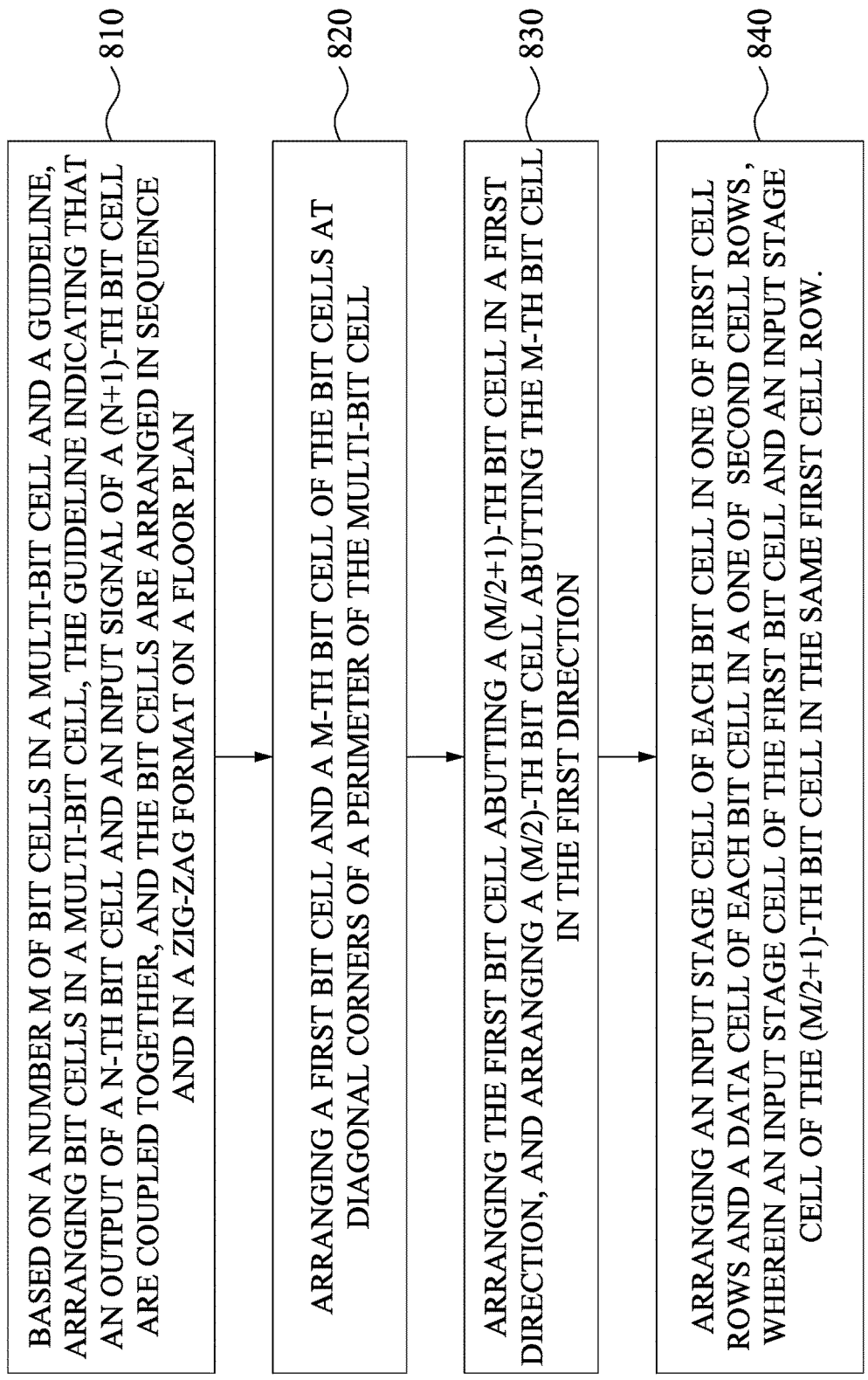
FIG. 8 is a flow chart of a method of generating a floor planning or layout for fabricating an integrated circuit, in accordance with some embodiments of the present disclosure.

Reference is now made to FIG. 7A. As shown in FIG. 7A, 8 bit cells in the cell CELL3 are arranged in accordance with the guideline. Specifically, the cell corresponding to bit 1 (i.e., the first bit cell) is in the first row and the first column, and the cell corresponding to bit 8 (i.e., the eighth bit cell) is in the last row and the second column next to the first column. Alternatively stated, the first and eighth bit cells are arranged diagonally in the cell CELL3. The cell corresponding to bit 2 (i.e., the second bit cell) abuts the first bit cell along y direction, and the cell corresponding to bit 5 (i.e., the fifth bit cell) abuts the first bit cell along x direction. Arrows in FIG. 7A indicate directions in which the first to third bit cells transmit output signals, the fourth bit cell transmits an output signal to the fifth bit cell, and the fifth to seventh bit cells transmit output signals. Alternatively stated, the first and fifth bit cells, abutting the same cell boundary extending in x direction, transmit output signals in the same direction.

Reference is now made to FIG. 7B. As illustratively shown in FIG. 7B, in cell CELL3, the bit cells CELL3a-CELL3h correspond to bit 1 to bit 8 separately, and are referred as the first to eighth bit cells. The first bit cell CELL3a abuts the cell boundary B1, and the eighth bit cell CELL3h abuts the cell boundary B2. The first to fourth bit cells CELL3a-CELL3d abut the cell boundary B3. The fifth and eighth bit cells abut the cell boundary B4. Alternatively stated, the fourth and fifth bit cells CELL3d-CELL3e are arranged in different cell rows.

For illustration, the cell CELL3 includes input stage cells 511-518 and data cells 521-528. In some embodiments, the input stage cells 511-518 are configured with respect to, for example, the input stage cell 211 of FIG. 2. The data cells 521-528 are configured with respect to, for example, the data cell 221 of FIG. 2. As shown in FIG. 7B, the input stage cell 511 and the data cell 521 are included in the bit cell CELL3a. The input stage cell 512 and the data cell 522 are included in the bit cell CELL3b. The input stage cell 513 and the data cell 523 are included in the bit cell CELL3c. The input stage cell 514 and the data cell 524 are included in the bit cell CELL3d. The input stage cell 515 and the data cell 525 are included in the bit cell CELL3e. The input stage cell 516 and the data cell 526 are included in the bit cell CELL3f. The input stage cell 517 and the data cell 527 are included in the bit cell CELL3g. The input stage cell 518 and the data cell 528 are included in the bit cell CELL3h.

For illustration, the input stage cells 511 of the first bit cell CELL3a and 515 of the fifth bit cell CELL3e are arranged in the top most row in the cell CELL3. The data cells 524 of the fourth bit cell CELL3d and 528 of the eighth bit cell CELL3h are arranged in the bottom most row in the cell CELL3. Accordingly, the data cells 521 of the first bit cell CELL3a and 525 of the fifth bit cell CELL3e are arranged in the same cell row. The input stage cells 512 of the second bit cell CELL3b and 516 of the sixth bit cell CELL3f are arranged in the same row. The arrangements of the input stage cells 513-514, 517-518 and the data cells 523 and 527 are similar to that of the input stage cells 512 and 516 and the data cells 521 and 525. Thus, the repetitious descriptions are omitted here.

With reference to FIGS. 7A-7B and the discussions above, in some embodiments, the signals output by the data cells 521 of the first bit cell CELL3a, 522 of the second bit cell CELL3b, 523 of the third bit cell CELL3c, 525 of the fifth bit cell CELL3e, 526 of the sixth bit cell CELL3f, and 527 of the seventh bit cell CELL3g are transmitted in the same direction (i.e., the negative direction of y axis).

As shown in FIG. 7B, the cell CELL3 further includes metal segments 610-680. In some embodiments, the metal segments 610-680 are configured with respect to, for example, the metal segment 310 of FIG. 3A. For illustration, a portion of the metal segment 610 is included in the data cell 521 of the first bit cell CELL3a, another portion of the metal segment 610 is included in the input stage cell 512 of the second bit cell CELL3b. A portion of the metal segment 620 is included in the data cell 522 of the second bit cell CELL3b, another portion of the metal segment 620 is included in the input stage cell 513 of the third bit cell CELL3c. A portion of the metal segment 630 is included in the data cell 523 of the third bit cell CELL3c, another portion of the metal segment 630 is included in the input stage cell 514 of the fourth bit cell CELL3d. A portion of the metal segment 640 is included in the data cell 524 of the fourth bit cell CELL3d, another portion of the metal segment 640 is included in the input stage cell 515 of the fifth bit cell CELL3e. A portion of the metal segment 650 is included in the data cell 525 of the fifth bit cell CELL3e, another portion of the metal segment 650 is included in the input stage cell 516 of the sixth bit cell CELL3f. A portion of the metal segment 660 is included in the data cell 526 of the sixth bit cell CELL3f, another portion of the metal segment 660 is included in the input stage cell 517 of the seventh bit cell CELL3g. A portion of the metal segment 670 is included in the data cell 527 of the seventh bit cell CELL3g, another portion of the metal segment 670 is included in the input stage cell 518 of the eighth bit cell CELL3h. The metal segment 680 is included in the data cell 528 of the eighth bit cell CELL3h.

For illustration, interconnects 711-717 extend in y direction. In some embodiments, the interconnects 711-717 are formed in the metal segments 610-670 separately. In some embodiments, the interconnects 711-717 are configured with respect to, for example, the interconnect 411 of FIG. 3A. For example, the interconnect 711 is shared by the first and second bit cells CELL3a-CELL3b to transmit the output signal of the first bit cell CELL3a as the input signal of the second bit cell CELL3b. The arrangements of the interconnects 712-717 are similar to the interconnect 711. Thus, the repetitious descriptions are omitted here.

In some embodiments, the interconnect 714 is included in a structure to connect the fourth bit cell CELL3d and the fifth bit cell CELL3e. In some embodiments, the interconnect 714 is arranged between the first bit cell CELL3a and the eight bit cells CELL3h. Alternatively stated, the first bit cell CELL3a and the eighth bit cells CELL3h are arranged at the opposite sides of the interconnect 714.

The configurations of FIGS. 7A-7B are given for illustrative purposes. Various implements of FIGS. 7A-7B are within the contemplated scope of the present disclosure. For example, in some embodiments, the bit cells in the cell CELL3 are arranged in sequence shown in FIGS. 4A, 5A, and 6A.

FIG. 8 is a flow chart of a method 800 of generating a floor planning or layout for fabricating the integrated circuit 10, in accordance with some embodiments of the present disclosure. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements. The method 800 includes operations 810-840 that are described below with reference to the multi-bit cell CELL1 of FIGS. 3A-3B.

In operation 810, based on a number, M being equal to 4, of the bit cells CELLa-CELLd in the cell CELL1 and the guideline, the bit cells CELLa-CELLd are arranged in the cell CELL1. In some embodiments, the guideline indicates that an output of a n-th bit cell and an input signal of a (n+1)-th bit cell are coupled together, and the bit cells are arranged in sequence and in a zig-zag format on the floor plan, as shown in FIGS. 3A-3B.

In operation 820, as illustratively shown in FIG. 3A, the first bit cell CELLa and the fourth bit cell CELLd are arranged at diagonal corners of a perimeter of the cell CELL1.

In operation 830, the first bit cell CELLa abuts the third bit cell CELLc in x direction, and the second bit cell CELLb abuts the fourth bit cell CELLd in x direction.

In some embodiments, the method further includes steps of arranging the first and third bit cells CELLa and CELLc abutting the cell boundary B1, arranging the second and fourth bit cells CELLb and CELLd abutting the cell boundary B2, arranging the first and second bit cells CELLa-CELLb abutting the cell boundary B3, and arranging the third and fourth bit cells CELLc-CELLd abutting the cell boundary B4.

In operation 840, as shown in FIG. 3A, the input stage cells 211-214 of the bit cells CELLa-CELLd are arranged in one of cell rows of the first group A, and the data cells 221-224 of the bit cells CELLa-CELLd are arranged in one of cell rows of the second group B. In some embodiments, the input stage cell 211 of the first bit cell CELLa and the input stage cell 213 of the third bit cell CELLc are arranged in the same cell row of the first group A.

Figure 9:
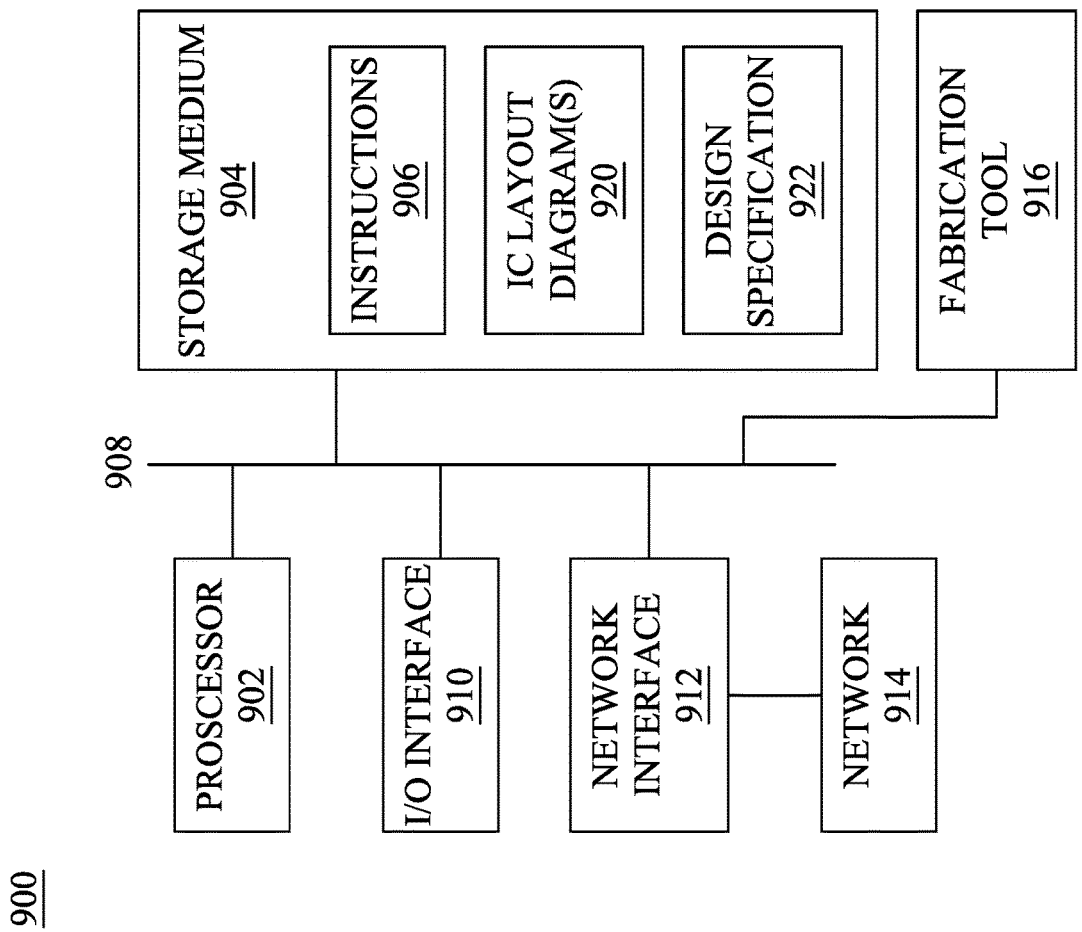
FIG. 9 is a block diagram of a system for designing the integrated circuit layout design, in accordance with some embodiments of the present disclosure.

Reference is now made to FIG. 9. FIG. 9 is a block diagram of an electronic design automation (EDA) system 900 for designing the integrated circuit layout design, in accordance with some embodiments of the present disclosure. EDA system 900 is configured to implement one or more operations of the method 800 disclosed in FIG. 8, and further explained in conjunction with FIGS. 1A-7B. In some embodiments, EDA system 900 includes an APR system.

In some embodiments, EDA system 900 is a general purpose computing device including a hardware processor 902 and a non-transitory, computer-readable storage medium 904. Storage medium 904, amongst other things, is encoded with, i.e., stores, computer program code (instructions) 906, i.e., a set of executable instructions. Execution of instructions 906 by hardware processor 902 represents (at least in part) an EDA tool which implements a portion or all of, e.g., the method 800.

The processor 902 is electrically coupled to computer-readable storage medium 904 via a bus 908. The processor 902 is also electrically coupled to an I/O interface 910 and a fabrication tool 916 by bus 908. A network interface 912 is also electrically connected to processor 902 via bus 908. Network interface 912 is connected to a network 914, so that processor 902 and computer-readable storage medium 904 are capable of connecting to external elements via network 914. The processor 902 is configured to execute computer program code 906 encoded in computer-readable storage medium 904 in order to cause EDA system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EDA system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores IC layout diagram 920 of standard cells including such standard cells as disclosed herein, for example, cells corresponding to the multi-bit cells CELL1-CELL3 discussed above with respect to FIGS. 1A-7B.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows EDA system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-964. In one or more embodiments, a portion or all of noted processes and/or methods are implemented in two or more systems 900.

EDA system 900 also includes the fabrication tool 916 coupled to processor 902. The fabrication tool 916 is configured to fabricate integrated circuits, e.g., the integrated circuits 10 with the multi-bit cells CELL1-CELL3 discussed above with respect to FIGS. 1A-7B, according to the design files processed by the processor 902.

EDA system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as design specification 922.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 900. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
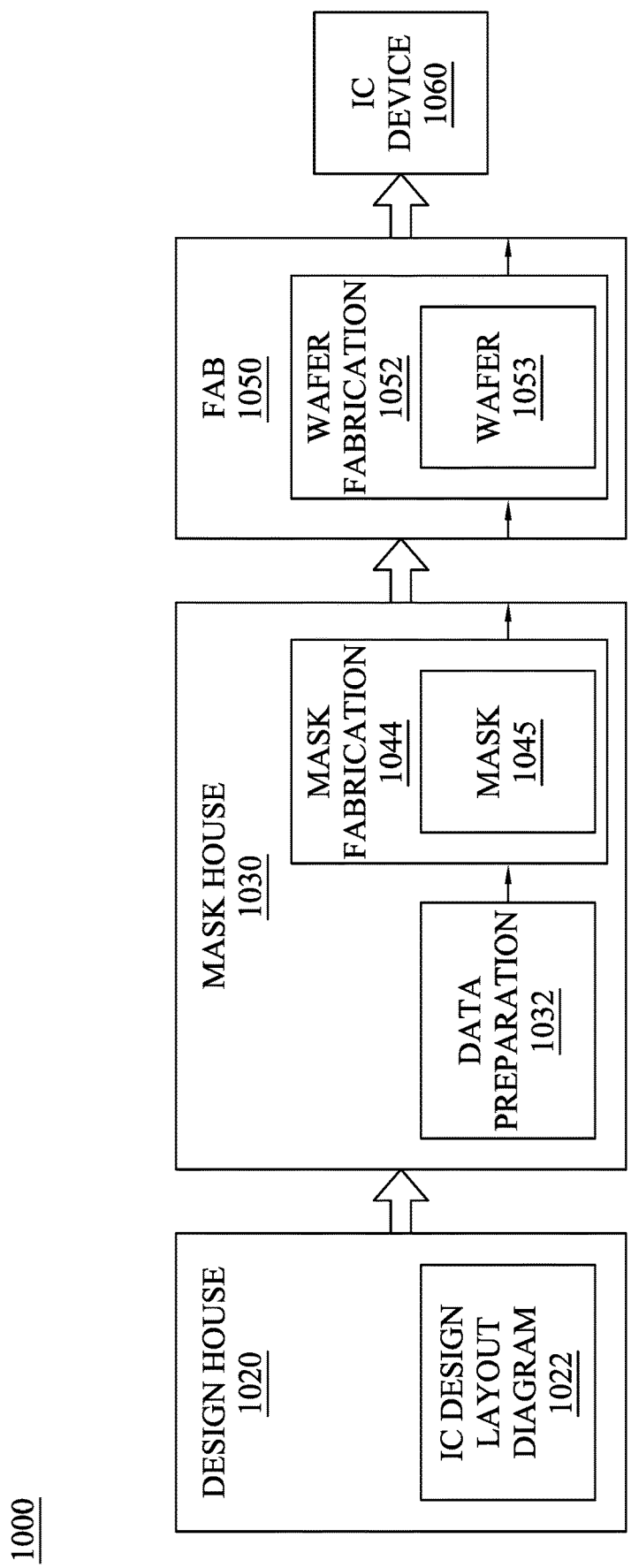
FIG. 10 is a block diagram of an integrated circuit manufacturing system, and an integrated circuit manufacturing flow associated therewith, in accordance with some embodiments.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single entity. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns, for example, an IC layout design depicted in FIGS. 1A-7B, designed for an IC device 1060, for example, integrated circuits 100 and 700 discussed above with respect to FIGS. 1A-7B. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1020 implements a proper design procedure to form IC design lay out diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The IC design layout diagram 1022 is manipulated by mask data preparation 1032 to comply with particular characteristics of the mask writer and/or requirements of IC fab 1050. In FIG. 10, data preparation 1032 and mask fabrication 1044 are illustrated as separate elements. In some embodiments, data preparation 1032 and mask fabrication 1044 can be collectively referred to as mask data preparation.

In some embodiments, data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1045 includes a transparent substrate (for example, fused quartz) and an opaque material (for example, chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

As described above, bit cells in an integrated circuit in the present disclosure are arranged in accordance with a guideline, which indicates that bit cells are placed in sequence and in a zig-zag format in a floor plan. By implementing the floor plan to the integrated circuit, efficiency of power, performance, and area usage of the integrated circuit are improved.

In some embodiments, an integrated circuit disclosed here includes a multi-bit cell having multiple bit cells disposed in multiple cell rows. The bit cells include M bit cells, M being positive integers. A first bit cell of the bit cells and a M-th bit cell of the bit cells are arranged diagonally in different cell rows in the multi-bit cell. The multi-bit cell includes first to fourth cell boundaries. The first and second boundaries extend in a first direction and the third and fourth boundaries extend in a second direction different from the first direction. The first bit cell and a second bit cell of the bit cells abut the third cell boundary, and the first bit cell and a (M/2+1)-th bit cell of the bit cells abut the first cell boundary. In some embodiments, the cell rows include a first plurality of cell rows with a first row height and a second plurality of cell rows with a second row height different from the first row height. In some embodiments, each of the bit cells includes one of the first plurality of cell rows and one of the second plurality of cell rows. In some embodiments, each of the bit cells includes an input stage cell and a data cell. The input stage cell in each of the bit cells is included in one of the first plurality of cell rows, and the data cell in each of the bit cells is included in one of the second plurality of cell rows. In some embodiments, the first row height is greater than the second row height. In some embodiments, an N-th bit cell and an (N+2)-th bit cell of the M bit cells are included in the same cell row in the multi-bit cell. In some embodiments, the integrated circuit further includes a first interconnect extending from an N-th bit cell to an (N+1)-th bit cell and shared by the N-th bit cell and the (N+1)-th bit cell to transmit an output signal of the N-th bit cell as an input signal of the (N+1)-th bit cell. In some embodiments, the integrated circuit further includes a second interconnect extending from a (M/2)-th bit cell to the (M/2+1)-th bit cell and configured to transmit an output signal of the (M/2)-th bit cell as an input signal of the (M/2+1)-th bit cell. The (M/2)-th bit cell and the (M/2+1)-th bit cell are arranged in different column and different cell rows.

Also disclosed is an integrated circuit that includes a first plurality of cell rows each having a first number of fin structures; a second plurality of cell rows each having a second number, smaller than the first number, of fin structures; and multiple bit cells in a multi-bit cell that have M bit cells each including an input stage cell in one of the first plurality of cell rows and a data cell in one of the second plurality of cell rows. An input stage cell of a first bit cell in the bit cells and an input stage cell of a (M/2+1)-th bit cell in the bit cells are included in the same cell row of the multi-bit cell, wherein M and N are positive integers, and N is smaller than M. In some embodiments, the input stage cell of a (M/2)-th bit cell in the bit cells and the input stage cell of a M-th bit cell in the bit cells are arranged in the same cell row. In some embodiments, the input stage cell of the first bit cell and the input stage cell of the (M/2+1)-th bit cell are arranged in the same cell row. In some embodiments, a signal output by the data cell of the first bit cell and a signal output by the data cell of the (M/2+1)-th bit cell are transmitted in the same direction. In some embodiments, a signal output by the data cell of the first bit cell is transmitted

19 in a first direction, and a signal output by the data cell of a (M/2)-th bit cell in the bit cells is transmitted in a second direction different from the first direction. In some embodiments, the integrated circuit further includes an interconnect extending in a column direction and shared by two bit cells, abutting each other along the column direction, of the bit cells. In some embodiments, the integrated circuit further includes an interconnect extending in a column direction to connect a (M/2)-th bit cell of the bit cells and the (M/2+1)-th bit cell. The first bit cell and the (M/2+1)-th bit cell are arranged at opposite sides of the interconnect.

Also disclosed is a method including operations as below: arranging multiple input stage cells in multiple first rows each having a first row height; and arranging multiple data cells in multiple second rows each having a second row height different from the first row height. The input stage cells and the data cells are interlaced with each other. A first data cell, corresponding to a first bit of M bits in a multi-bit cell, in the data cells is configured to output a first bit data as an output signal to a first input stage cell, corresponding to a second bit, in the the input stage cells. A second data cell, corresponding to the second bit, in the data cells is configured to output a second bit as an output signal to a second input stage cell, corresponding to a third bit, in the input stage cells. The first and second data cells are arranged diagonally. In some embodiments, the first data cell and the first input stage cell are arranged in the same column. In some embodiments, arranging the data cells includes arranging the first data cell and a second data cell, corresponding to (M/2)-th bit in the multi-bit cell, in the same column and in different rows of plurality of second rows.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a multi-bit cell having a plurality of bit cells disposed in a plurality of cell rows, wherein the plurality of bit cells include M bit cells, M being positive integers,
   wherein a first bit cell of the plurality of bit cells and a M-th bit cell of the plurality of bit cells are arranged diagonally in different cell rows in the multi-bit cell,
   wherein the multi-bit cell includes first to fourth cell boundaries, wherein the first and second boundaries extend in a first direction and the third and fourth boundaries extend in a second direction different from the first direction,
   wherein the first bit cell and a second bit cell of the plurality of bit cells abut the third cell boundary, and the first bit cell and a (M/2+1)-th bit cell of the plurality of bit cells abut the first cell boundary.

2. The integrated circuit of claim 1, wherein the plurality of cell rows comprise a first plurality of cell rows with a first row height and a second plurality of cell rows with a second row height different from the first row height.

20

3. The integrated circuit of claim 2, wherein each of the plurality of bit cells includes one of the first plurality of cell rows and one of the second plurality of cell rows.

4. The integrated circuit of claim 2, wherein each of the plurality of bit cells includes an input stage cell and a data cell,
   wherein the input stage cell in each of the plurality of bit cells is included in one of the first plurality of cell rows, and the data cell in each of the plurality of bit cells is included in one of the second plurality of cell rows.

5. The integrated circuit of claim 4, wherein the first row height is greater than the second row height.

6. The integrated circuit of claim 1, wherein the (M/2+1)-th bit cell and the M-th bit cell of the plurality of bit cells abut the fourth cell boundary.

7. The integrated circuit of claim 1, wherein an N-th bit cell and an (N+2)-th bit cell of the M bit cells are included in the same cell row in the multi-bit cell, wherein N is a positive integer.

8. The integrated circuit of claim 1, further comprising:
   a first interconnect extending from an N-th bit cell to an (N+1)-th bit cell and shared by the N-th bit cell and the (N+1)-th bit cell to transmit an output signal of the N-th bit cell as an input signal of the (N+1)-th bit cell, wherein N is a positive integer.

9. The integrated circuit of claim 8, further comprising:
   a second interconnect extending from a (M/2)-th bit cell to the (M/2+1)-th bit cell and configured to transmit an output signal of the (M/2)-th bit cell as an input signal of the (M/2+1)-th bit cell,
   wherein the (M/2)-th bit cell and the (M/2)-th bit cell are arranged in different column and different cell rows.

10. An integrated circuit, comprising:
    a first plurality of cell rows each having a first number of fin structures;
    a second plurality of cell rows each having a second number, smaller than the first number, of fin structures; and
    a plurality of bit cells in a multi-bit cell that have M bit cells each comprising an input stage cell in one of the first plurality of cell rows and a data cell in one of the second plurality of cell rows,
    wherein an input stage cell of a first bit cell in the plurality of bit cells and an input stage cell of a (M/2+1)-th bit cell in the plurality of bit cells are included in the same cell row of the multi-bit cell, wherein M and N are positive integers, and N is smaller than M.

11. The integrated circuit of claim 10, wherein the input stage cell of a (M/2)-th bit cell in the plurality of bit cells and the input stage cell of a M-th bit cell in the plurality of bit cells are arranged in the same cell row.

12. The integrated circuit of claim 10, wherein the input stage cell of the first bit cell and the input stage cell of the (M/2+1)-th bit cell are arranged in the same cell row.

13. The integrated circuit of claim 10, wherein a signal output by the data cell of the first bit cell and a signal output by the data cell of the (M/2+1)-th bit cell are transmitted in the same direction.

14. The integrated circuit of claim 10, wherein a signal output by the data cell of the first bit cell is transmitted in a first direction, and
    a signal output by the data cell of a (M/2)-th bit cell in the plurality of bit cells is transmitted in a second direction different from the first direction.

15. The integrated circuit of claim 10, further comprising:
an interconnect extending in a column direction and shared by two bit cells, abutting each other along the column direction, of the plurality of bit cells.

16. The integrated circuit of claim 10, further comprising:
an interconnect extending in a column direction to connect a (M/2)-th bit cell of the plurality of bit cells and the (M/2+1)-th bit cell,
wherein the first bit cell and the (M/2+1)-th bit cell are arranged at opposite sides of the interconnect.

17. A method, comprising:
arranging a plurality of input stage cells in a plurality of first rows each having a first row height; and
arranging a plurality of data cells in a plurality of second rows each having a second row height different from the first row height, wherein the plurality of input stage cells and the plurality of data cells are interlaced with each other,
wherein a first data cell, corresponding to a first bit of M bits in a multi-bit cell, in the plurality of data cells is configured to output a first bit data as an output signal to a first input stage cell, corresponding to a second bit, in the plurality of the input stage cells, wherein M is a positive integer.

18. The method of claim 17, wherein a second data cell, corresponding to the second bit, in the plurality of data cells is configured to output a second bit as an output signal to a second input stage cell, corresponding to a third bit, in the plurality of input stage cells,
wherein the first and second data cells are arranged diagonally.

19. The method of claim 17, wherein the first data cell and the first input stage cell are arranged in the same column.

20. The method of claim 17, wherein arranging the plurality of data cells comprises:
arranging the first data cell and a second data cell, corresponding to (M/2)-th bit in the multi-bit cell, in the same column and in different rows of plurality of second rows.

* * * * *